United States Patent
Tseng

[19]

[11] Patent Number: 5,888,863
[45] Date of Patent: Mar. 30, 1999

[54] METHOD TO FABRICATE CAPACITORS IN MEMORY CIRCUITS

[75] Inventor: Horng-Huei Tseng, HsinChu, Taiwan

[73] Assignee: Vanguard International Semiconductor Corporation, Hsin-Chu, Taiwan

[21] Appl. No.: 649,979

[22] Filed: May 16, 1996

[51] Int. Cl.$^6$ .............................................. H01L 21/8242
[52] U.S. Cl. ........................................... 438/253; 438/396
[58] Field of Search ................................... 438/253, 254, 438/396, 397

[56] References Cited

U.S. PATENT DOCUMENTS

| | | | |
|---|---|---|---|
| 4,742,018 | 5/1988 | Kimura et al. | 437/48 |
| 5,281,549 | 1/1994 | Fazan et al. | 437/52 |
| 5,444,010 | 8/1995 | Park et al. | 437/60 |
| 5,447,878 | 9/1995 | Park et al. | 437/52 |
| 5,604,148 | 2/1997 | Lur | 437/60 |
| 5,654,223 | 8/1997 | Jun et al. | 438/254 |
| 5,661,061 | 8/1997 | Usuami et al. | 438/254 |

*Primary Examiner*—John Niebling
*Assistant Examiner*—Joni Y. Chang
*Attorney, Agent, or Firm*—George O. Saile; Stephen B. Ackerman; Rosemary L.S. Pike

[57] ABSTRACT

A method is described for forming a dynamic random access memory cell with an increased capacitance capacitor. Semiconductor devices including a capacitor node contact region are formed. A layer of silicon nitride and an insulating layer are deposited over the devices. A contact is opened through the insulating and silicon nitride layers to the capacitor node contact region. A first layer of polysilicon is deposited over the insulating layer and within the contact opening. A layer of silicon oxide is deposited over the first polysilicon layer. The silicon oxide layer is patterned so as to leave this layer only in the area of the planned capacitor and extending outward from the contact opening a first distance. The first polysilicon layer is patterned so as to leave this layer only in the area of the planned capacitor and extending outward from the contact opening a second distance smaller than the first distance. A second layer of polysilicon is deposited over the silicon oxide layer. The second polysilicon layer is removed except for spacers on the sidewalls of the silicon oxide layer and portions underlying the spacers. The silicon oxide and insulating layers are etched away leaving the first polysilicon layer with a cylindrical shape wherein the second polysilicon layer has both a horizontal and a vertical fin on each of two sides of its structure. A capacitor dielectric layer and a third polysilicon layer are deposited and patterned to complete formation of the DRAM with capacitor.

24 Claims, 4 Drawing Sheets

METHOD TO FABRICATE CAPACITORS IN MEMORY CIRCUITS

BACKGROUND OF THE INVENTION (1) Field of the Invention

The present invention relates to a method of fabricating a dynamic random access memory having an increased capacitance capacitor by incorporating a cylindrical electrode having a fin structure.

(2) Description of the Prior Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering of the source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked capacitor design in which the capacitor cell uses the space over the device area for the capacitor plates. In their U.S. Pat. No. 5,444,010 to Park et al, the inventors describe a method of forming a stacked capacitor with a central recess on the planarized polysilicon layer. The top plate wraps under the storage electrode. U.S. Pat. No. 4,742,018 to Fazan et al shows a method of making a stacked capacitor having an I-shaped cross-section. U.S. Pat. No. 5,447,878 to Park et al teaches a method of forming a horizontally-finned auxiliary electrode underneath the main electrode.

SUMMARY OF THE INVENTION

Accordingly, it is a primary object of the invention to provide an improved and very manufacturable process for producing a memory cell capacitor with increased capacitance.

A method is described for forming a dynamic random access memory cell with an increased capacitance capacitor. Relatively thick field oxide areas are formed on the surface of a semiconductor substrate while leaving device areas for fabrication of semiconductor devices. Device structures are formed within the device areas of the semiconductor substrate wherein the device structures include a capacitor node contact region within the silicon substrate. The capacitors are formed by the following steps. A layer of silicon nitride is deposited overlying the semiconductor device structures. An insulating layer is deposited overlying the silicon nitride layer. A contact is opened through the insulating layer and the silicon nitride layer to the capacitor node contact region. A first layer of polysilicon is deposited overlying the insulating layer and filling the contact opening. A layer of silicon oxide is deposited overlying the first polysilicon layer. The silicon oxide layer is patterned so as to leave remaining portions of this layer only in the area of the planned capacitor and extending outward from the contact openings a first distance. The first polysilicon layer is patterned so as to leave remaining portions of this layer only in the area of the planned capacitor and extending outward from the contact openings a second distance wherein the first distance is greater than the second distance. A second layer of polysilicon is deposited overlying the silicon oxide layer. The second polysilicon layer is removed except for spacers on the sidewalls of the silicon oxide layer and portions of the second layer underlying the spacers. The silicon oxide layer and the insulating layer are etched away leaving the first polysilicon layer with a cylindrical shape wherein the second polysilicon layer has both a horizontal and a vertical fin on each of two sides of its structure. A capacitor dielectric layer is deposited over all exposed surfaces of the substrate. A third polysilicon layer is deposited conformally so that the third polysilicon layer covers the first and second polysilicon layers to complete formation of the DRAM with capacitor.

According to another aspect of the present invention, a dynamic random access memory having a high capacitance capacitor is described. Field oxide areas on the surface of a semiconductor substrate surround device areas for fabrication of field effect devices, gate dielectric and electrode structures on the substrate in the device areas. Source/drain structures associated with the gate structures lie within the device areas of the semiconductor substrate. A capacitor structure comprises a bottom electrode formed by the central cylindrical portion of a first polysilicon layer which electrically contacts the source/drain structures, a storage node having a cylindrical finned shape having horizontal and vertical fins wherein the horizontal fins are formed by a second polysilicon layer extending horizontally for a distance from two sides of the top of the central cylindrical portion of the first polysilicon layer and wherein the vertical fins are formed by the second polysilicon layer having a horizontal part extending horizontally from the same two sides of the top of the central cylindrical portion of the first polysilicon layer to the same distance and then extending vertically upward from the central portion wherein there is a gap between the horizontal fins and the horizontal part of the vertical fins, a capacitor dielectric layer overlying all surfaces of the storage node, and a top plate electrode layer overlying the capacitor dielectric layer on all surfaces of the storage node to complete the capacitor.

BRIEF DESCRIPTION OF THE DRAWINGS

In the following drawings forming a material part of this description, there is shown.

DESCRIPTION OF THE PREFERRED EMBODIMENTS

Figure 1:
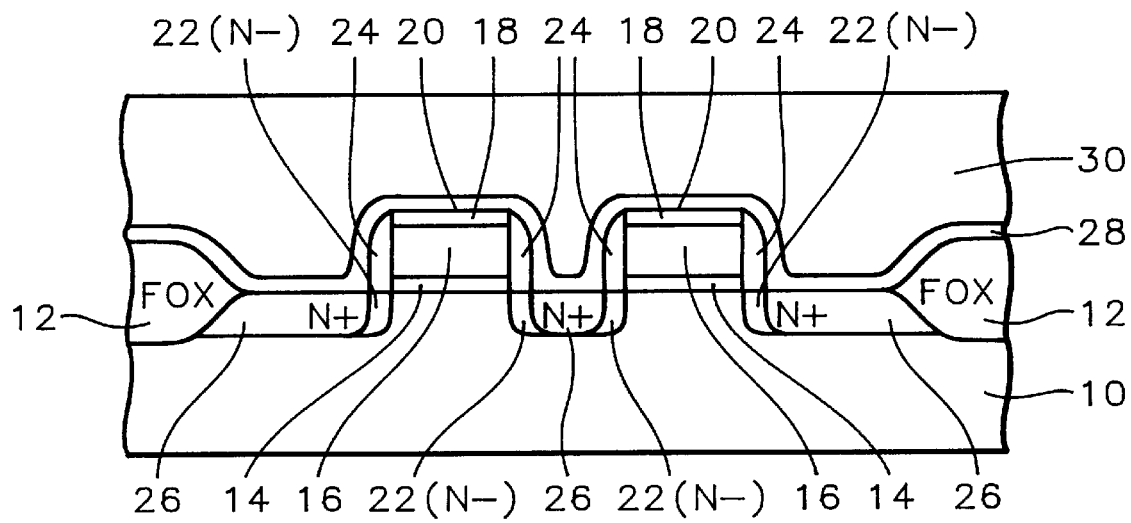
FIGS. 1 through 8 are schematic cross-sectional representations of a preferred embodiment of the present invention.

Referring now more particularly to FIG. 1, the first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, field oxide regions 12 are formed in and on the semiconductor substrate.

The surface of the silicon substrate 10 is thermally oxidized to form the desired gate oxide 14 thickness. The preferred thickness is between about 100 to 200 Angstroms. The polysilicon layer 16 is blanket deposited by low pressure chemical vapor deposition (LPCVD) to a preferred thickness of between about 2000 to 4000 Angstroms. A layer 18 of silicon oxide is chemically vapor deposited over the surface of the polysilicon to a thickness of between about 600 to 1500 Angstroms. The layers 14, 16, and 18 are patterned by lithography and anisotropic etching techniques as are conventional in the art to provide a desired pattern of gate electrodes and interconnection runners 20 as seen in FIG. 1.

The source/drain structure of the MOS FET may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example, shows the ion implantations of N- dopants. Lithographic masks may be required to protect the areas not to be subjected to that particular N- ion implantation. The formation of the lithographic masks is done by conventional lithography and etching techniques. The N- lightly doped drain implantation 22 is done with, for example, phosphorus at a dosage of between about 1 E 13 to 1 E 14 atoms/$cm_2$ and an energy of between about 20 to 50 Kev.

The dielectric spacer 24 is now to be formed followed by the completion of the lightly doped drain source/drain structures. An LPCVD tetraethoxysilane (TEOS) deposition is preferred to a thickness of between about 1500 to 3000 Angstroms.

An anisotropic etching of this layer produces the dielectric spacer layer 24 on the sidewalls of the layer structures 20.

The heavily doped source and drain regions 26 are formed by implantation with, for example, arsenic ions at a dosage of between about 1 E 15 to 5 E 16 atoms/$cm^2$ and an energy of between about 30 to 100 Kev.

A layer of silicon nitride 28 is formed over the field oxide and device areas to a thickness of between about 800 to 2000 Angstroms. Next, a thick insulating layer, such as borophosphosilicate glass (BPSG) 30 or phosphosilicate glass (PSG) is deposited to a thickness of between about 5000 to 10,000 Angstroms. This insulating layer 30 is planarized, for example, by chemical mechanical polishing.

Figure 2:
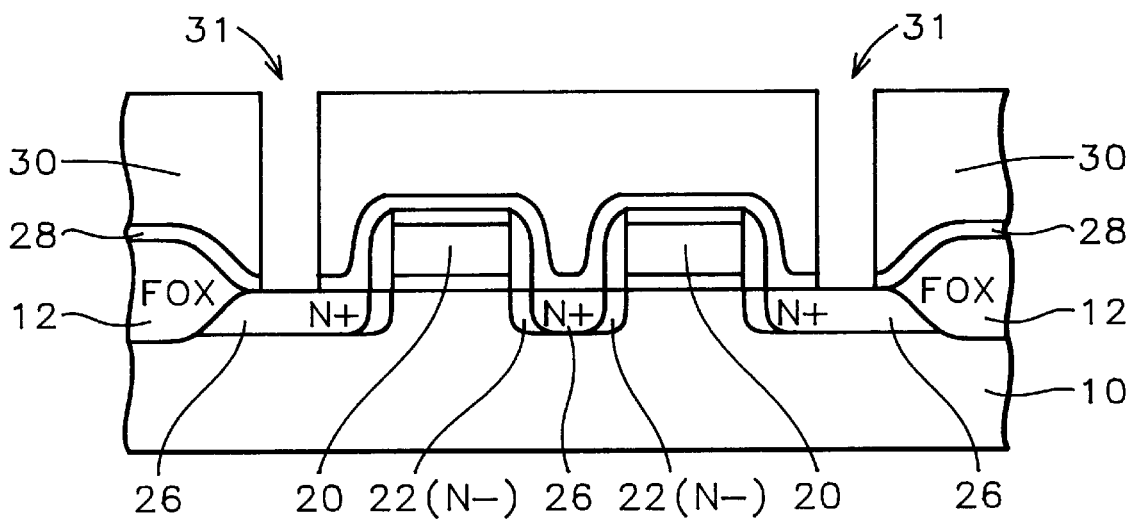

Referring now to FIG. 2, using conventional lithographic and etching techniques, contact openings are made through the BPSG or PSG layer 30 and silicon nitride layer 28 to the silicon substrate. Openings 31 are made to the node contact regions for the capacitor structures. The figures illustrate the fabrication of two capacitors.

Figure 3:
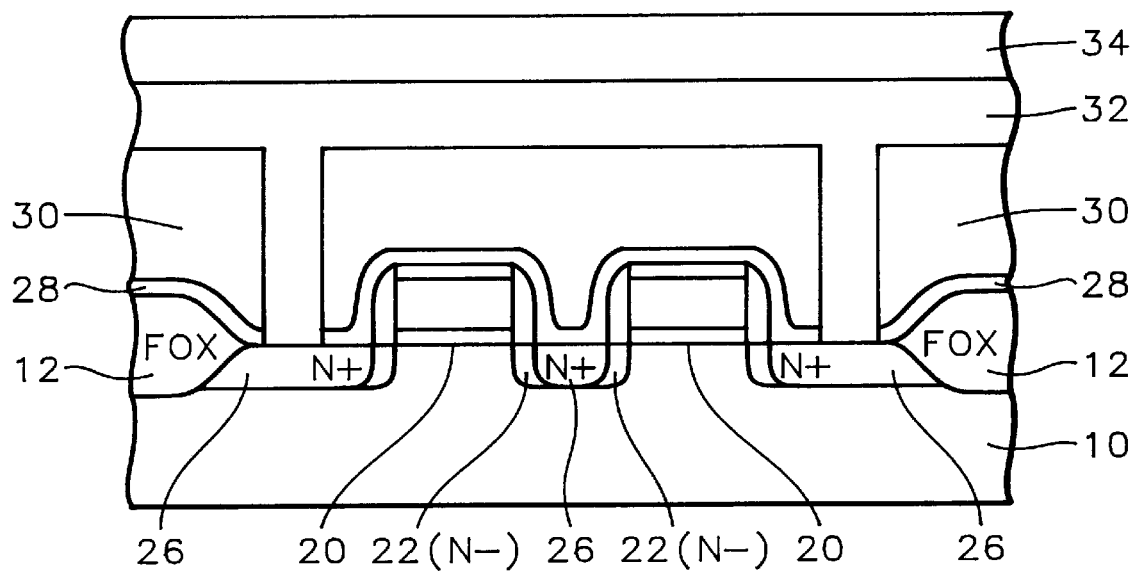

Referring now to FIG. 3, a first polysilicon layer 32 is deposited over BPSG layer 30 either in situ doped or doped after deposition by ion implantation. The thickness of this layer is between about 2000 to 6000 Angstroms.

A thick layer of silicon oxide 34, such as TEOS oxide deposited by LPCVD, is deposited over layer 32. The thickness of layer 34 is between about 2000 to 6000 Angstroms.

Figure 4:
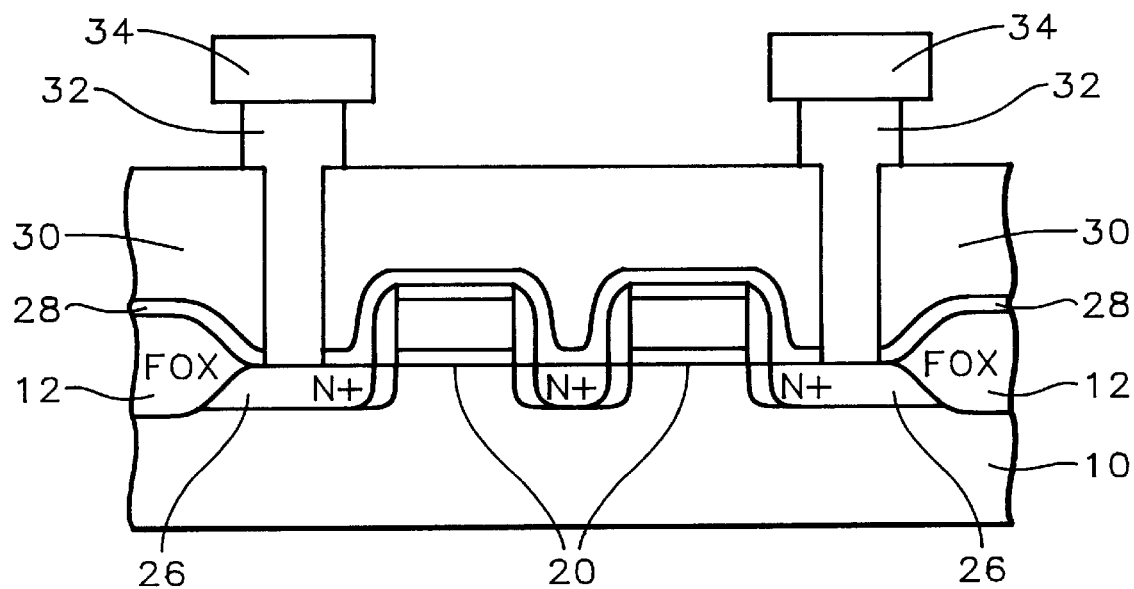

Referring now to FIG. 4, the thick silicon oxide layer 34 and the polysilicon layer 32 are patterned by reactive ion etching, such as magnetic-enhanced reactive ion etching (MERIE) using the gases $CF_4$, $CHF_3$, and Ar, so as to have their remaining portions over the planned capacitor area. The layers 32 and 34 can be etched simultaneously in a multi-chamber etcher, or they can be etched separately in a single-chamber etcher. After the etching of layers 34 and 32 is completed, the remaining polysilicon 32 is between about 500 to 1500 Angstroms wider than the contact opening. The remaining silicon oxide 34 is another 1000 to 3000 Angstroms wider than the remaining polysilicon layer 32.

Figure 5:
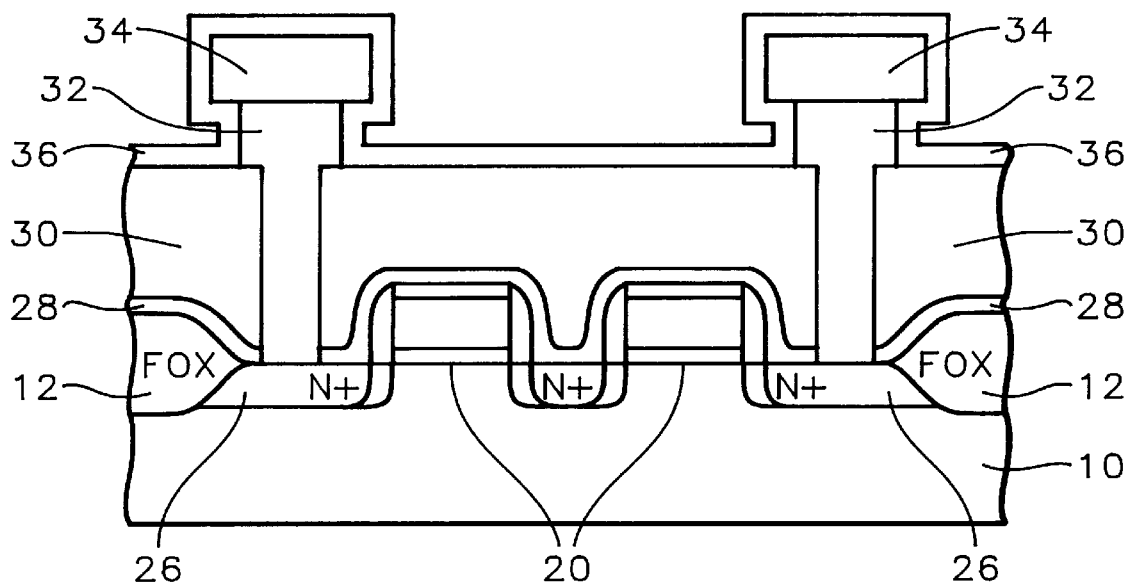
Figure 6:
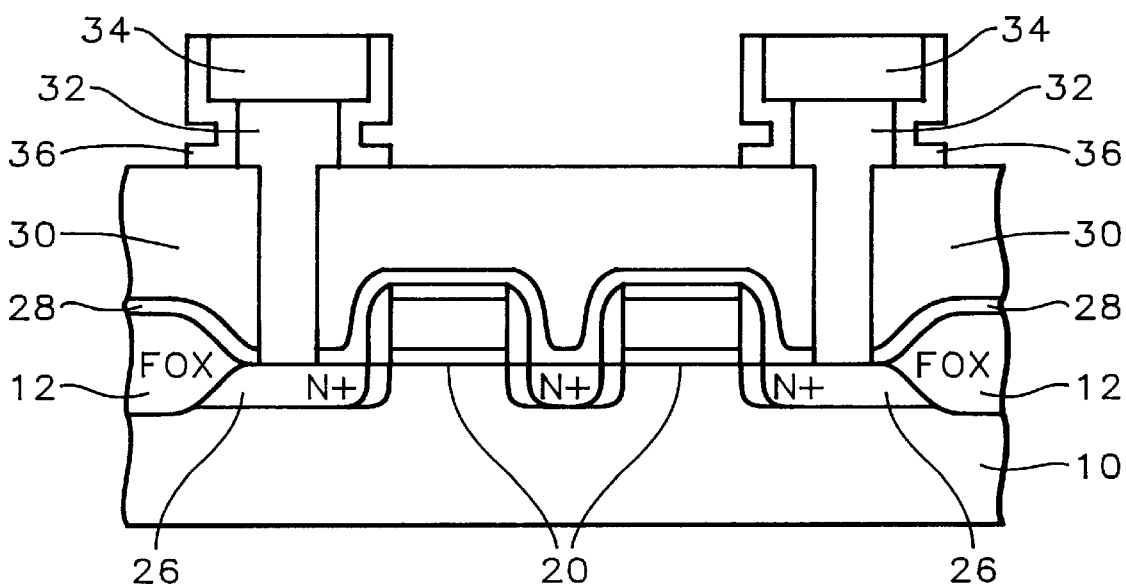

Referring now to FIG. 5, a second layer of polysilicon 36 is deposited conformally over the patterned first polysilicon layer 32 and thick silicon oxide layer 34. The layer 36 is a thin doped polysilicon layer with a thickness of between about 500 to 1500 Angstroms. It is deposited by LPCVD and is in-situ doped with phosphorus. The thin polysilicon layer 36 is etched by reactive ion etching (RIE) to remove the layer 36 from the top surfaces of the oxide layer 34 and to remove layer 36 from the surface of the BPSG layer 30 except where it is directly underneath the oxide layer 34 and its sidewall portion of layer 36, as seen in FIG. 6. This etching may also be a MERIE etching using the gases $Cl_2$ and HBr.

Figure 7:
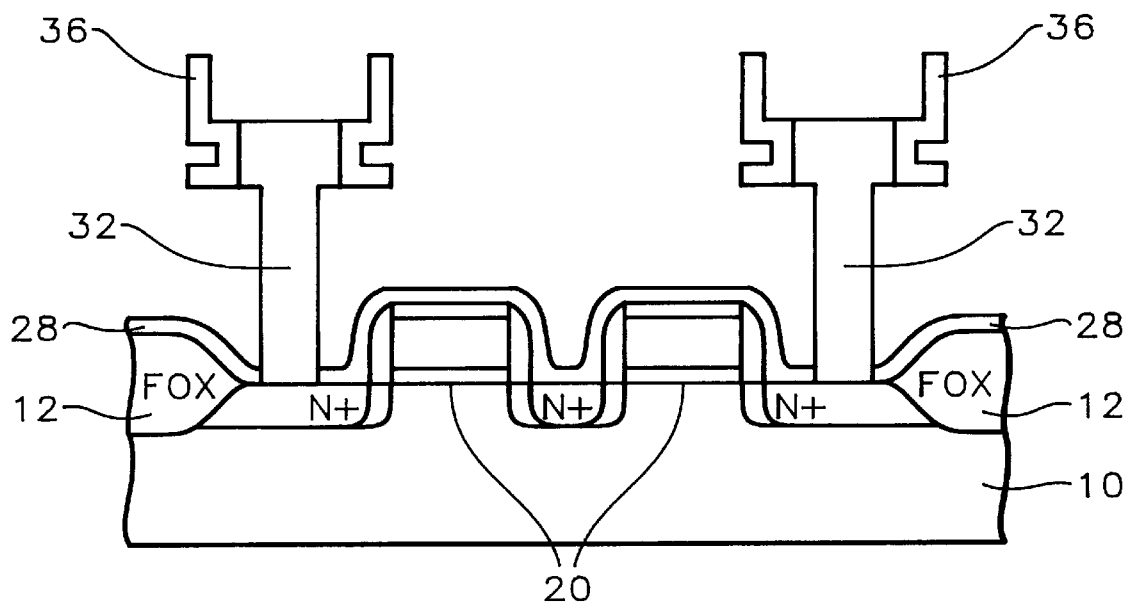

The silicon oxide layer 34 and BPSG layer 30 are removed, for example, by using a hydrofluoric acid solution, resulting in FIG. 7. The portion of layer 32 contacting the node contact region forms the bottom electrode of the capacitor. Layers 32 and 36 together form the storage node of the capacitor.

Figure 8:
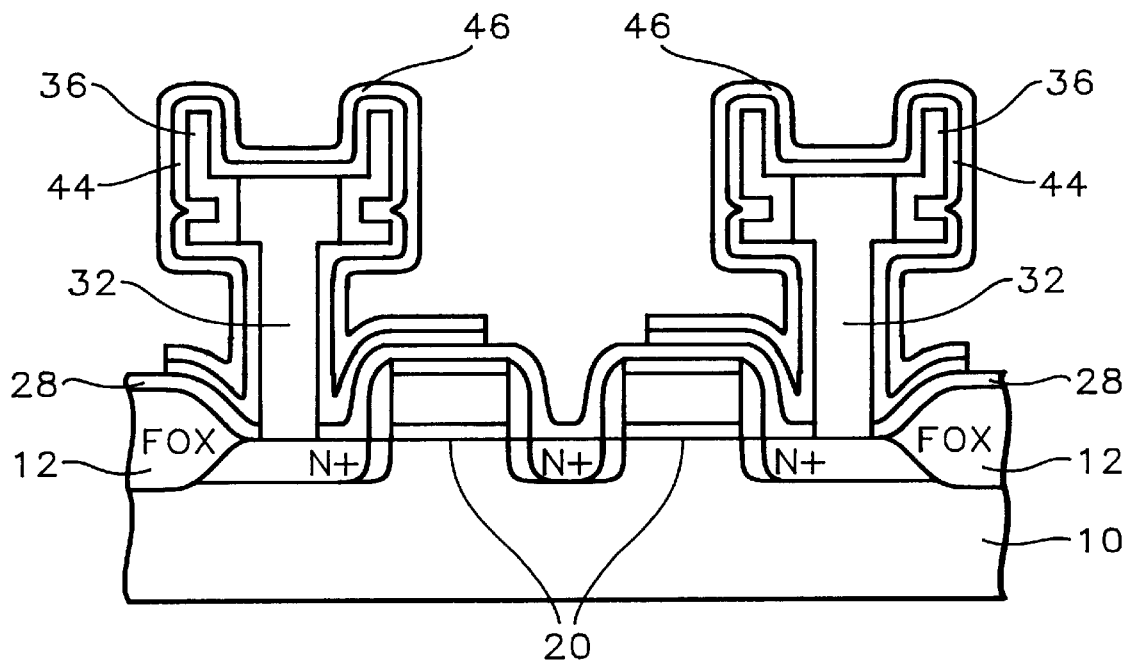

Referring now to FIG. 8, the capacitor dielectric layer 44 is now formed over all exposed surfaces of the polysilicon layers 32 and 36 which form the storage node of the capacitor. The layer is typically either composed of layers of silicon nitride and silicon oxide (NO) or layers of silicon oxide, silicon nitride and silicon oxide (ONO). In making the ONO dielectric, the first or bottom silicon oxide, 0 layer is usually a native oxide grown to a thickness of about 15 Angstroms. The silicon nitride, N layer is formed by LPCVD to give a resulting thickness of between about 80 to 200 Angstroms. The top silicon oxide, O layer may be formed in an oxidation furnace. The total ONO thickness is in the order of between about 100 to 300 Angstroms.

The top plate electrode is formed by depositing by LPCVD a third polysilicon layer 46 which is in-situ phosphorus doped. The thickness of this layer 46 is between about 1000 to 2500 Angstroms. The layers 44 and 46 are patterned by MERIE to complete the fabrication of the capacitor structures.

The process of the present invention provides a robust and very manufacturable method of fabricating a dynamic random access memory cell capacitor with increased capacitance.

The DRAM integrated circuit with increased capacitance capacitor of the present invention is described with reference to FIG. 8. MOS devices, such as gate electrodes and interconnection runners 20 lie on a semiconductor substrate. Source and drain regions 26 lie within the semiconductor substrate not covered by the MOS devices. Stacked capacitors contact the source regions 26. The storage node of the capacitor comprises a cylindrical polysilicon structure 32 and a finned polysilicon structure 36 having both a horizontal and a vertical fin on each of two sides of its structure. The capacitor dielectric comprises NO or ONO 44 covering all surfaces of the storage node 32 and 36. The top electrode 46 comprises polysilicon overlying the capacitor dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:

forming field oxide regions in and on a semiconductor substrate;

forming a gate silicon oxide layer over the surface of said semiconductor substrate;

depositing a gate polysilicon layer overlying said gate silicon oxide layer and patterning said gate polysilicon to form gate electrodes;

depositing and etching a spacer silicon oxide to form spacers on the sidewalls of said gate electrodes;

forming source and drain regions within said semiconductor substrate;

depositing a layer of silicon nitride overlying said gate electrodes and the surfaces of said semiconductor substrate;

depositing an insulating layer overlying said silicon nitride layer;

opening a contact through said insulating layer and said silicon nitride layer to said source region within said silicon substrate which will form the node of said capacitor;

depositing a first layer of polysilicon overlying said insulating layer and filling said contact opening wherein the portion of said first polysilicon layer contacting said source region which forms said node will be the bottom electrode of said capacitor;

depositing a layer of silicon oxide overlying said first polysilicon layer;

etching away said silicon oxide layer and said first polysilicon layer leaving said first polysilicon layer only within said contact openings and extending outward from said contact openings a first distance and leaving said silicon oxide layer overlying said first polysilicon layer and extending outward from said contact openings a second distance wherein said second distance is greater than said first distance;

depositing a second layer of polysilicon conformally overlying the top surfaces of said insulating layer, the side surfaces of said first polysilicon layer, and the top, side, and a portion of the bottom surfaces of said silicon oxide layer;

etching away said second polysilicon layer on the top surfaces of said silicon oxide layer and on the top surfaces of said insulating layer except where said second polysilicon layer lies on the top surfaces of said insulating layer underlying said silicon oxide layer and said second polysilicon layer on the side surfaces of said silicon oxide layer;

etching away said silicon oxide layer and said insulating layer wherein said first polysilicon layer has a cylindrical shape and wherein said second polysilicon layer has both a horizontal and a vertical fin on each of two sides of its structure and wherein said first and second polysilicon layers form the storage node of said capacitor;

depositing a capacitor dielectric layer over all surfaces of said substrate wherein said capacitor dielectric layer will cover exposed top and bottom surfaces of said first and second polysilicon layers;

depositing a third polysilicon layer overlying said capacitor dielectric layer wherein said third polysilicon layer forms the top electrode of said capacitor to complete formation of said DRAM with capacitor.

2. The method according to claim 1 wherein said silicon nitride layer has a thickness of between about 800 to 2000 Angstroms.

3. The method according to claim 1 wherein said insulating layer comprises borophosphosilicate glass and has a thickness of between about 5000 to 10,000 Angstroms.

4. The method according to claim 1 wherein said insulating layer comprises phosphosilicate glass and has a thickness of between about 5000 to 10,000 Angstroms.

5. The method according to claim 1 wherein said first polysilicon layer has a thickness of between about 2000 to 6000 Angstroms.

6. The method according to claim 1 wherein said silicon oxide layer has a thickness of between about 2000 to 6000 Angstroms.

7. The method according to claim 1 wherein said etching away of said silicon oxide and said first polysilicon layers is done by magnetic-enhanced reactive ion etching.

8. The method according to claim 1 wherein said second polysilicon layer has a thickness of between about 500 to 1500 Angstroms.

9. The method according to claim 1 wherein said etching away of said silicon oxide and said insulating layers is done using a hydrofluoric acid solution.

10. The method according to claim 1 wherein said capacitor dielectric layer is composed of layers of silicon oxide, silicon nitride, and silicon oxide.

11. The method according to claim 1 wherein said third polysilicon layer has a thickness of between about 1000 and 2500 Angstroms.

12. A method for fabricating a dynamic random access memory (DRAM) having a capacitor comprising:

selectively forming relatively thick field oxide areas on the surface of a semiconductor substrate while leaving device areas for fabrication of semiconductor devices;

forming device structures within said device areas of said semiconductor substrate wherein said device structures include a capacitor node contact region within said silicon substrate; and forming said capacitors by:

depositing a layer of silicon nitride overlying said semiconductor device structures;

forming an insulating layer overlying said silicon nitride layer;

opening a contact through said insulating layer and said silicon nitride layer to said capacitor node contact region;

depositing a first layer of polysilicon overlying said insulating layer and filling said contact opening;

depositing a layer of silicon oxide overlying said first polysilicon layer;

patterning said silicon oxide so as to leave remaining portions of said layer only in the area of planned said capacitor and extending outward from said contact openings a first distance;

patterning said first polysilicon layer so as to leave remaining portions of said layer only in the area of planned said capacitor and extending outward from said contact openings a second distance wherein said first distance is greater than said second distance;

depositing a second layer of polysilicon overlying said thick silicon oxide layer;

etching away said second polysilicon layer to remove all of said second layer except for spacers on the sidewalls of said silicon oxide layer and portions of said second layer underlying said spacers;

etching away said silicon oxide layer and said insulating layer wherein said first polysilicon layer has a cylindrical shape and wherein said second polysilicon layer has both a horizontal and a vertical fin on each of two sides of its structure;

depositing a capacitor dielectric layer over all exposed surfaces of said substrate; and depositing a third polysilicon layer overlying said capacitor dielectric layer to complete formation of said DRAM with capacitor.

13. The method according to claim 12 wherein said device structures in said device areas are gate field effect transistor structures and associated source/drain regions which form a dynamic random access memory cell together with said capacitor.

14. The method according to claim 12 wherein the portion of said first polysilicon layer contacting said capacitor node contact region forms the bottom node of said electrode, said first and second polysilicon layers remaining form a cylindrical finned storage node of said capacitor and said third polysilicon layer forms the top electrode of said capacitor.

15. The method according to claim 12 wherein said silicon nitride layer has a thickness of between about 800 to 2000 Angstroms.

16. The method according to claim 12 wherein said insulating layer comprises borophosphosilicate glass and has a thickness of between about 5000 to 10,000 Angstroms.

17. The method according to claim 12 wherein said insulating layer comprises phosphosilicate glass and has a thickness of between about 5000 to 10,000 Angstroms.

18. The method according to claim 12 wherein said first polysilicon layer has a thickness of between about 2000 to 6000 Angstroms.

19. The method according to claim 12 wherein said silicon oxide layer has a thickness of between about 2000 to 6000 Angstroms.

20. The method according to claim 12 wherein said etching away of said silicon oxide and said first polysilicon layers is done using magnetic-enhanced reactive ion etching.

21. The method according to claim 12 wherein said second polysilicon layer has a thickness of between about 500 to 1500 Angstroms.

22. The method according to claim 12 wherein said etching away of said silicon oxide and said insulating layers is done using a hydrofluoric acid solution.

23. The method according to claim 12 wherein said capacitor dielectric layer is composed of layers of silicon oxide, silicon nitride, and silicon oxide.

24. The method according to claim 12 wherein said third polysilicon layer has a thickness of between about 1000 and 2500 Angstroms.

* * * * *